United States Patent
Nishimura et al.

(10) Patent No.: US 7,665,415 B2
(45) Date of Patent: Feb. 23, 2010

(54) SUBSTRATE PROCESSING APPARATUS

(75) Inventors: Kazuhiro Nishimura, Kyoto (JP); Masayoshi Shiga, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 399 days.

(21) Appl. No.: 11/351,017

(22) Filed: Feb. 9, 2006

(65) Prior Publication Data

US 2006/0174832 A1 Aug. 10, 2006

(30) Foreign Application Priority Data

Feb. 10, 2005 (JP) .............................. 2005-034098

(51) Int. Cl.
*B05C 11/00* (2006.01)
*B67D 5/08* (2006.01)
(52) U.S. Cl. ................... 118/713; 118/712; 118/697; 118/698; 118/708; 222/58; 222/65
(58) Field of Classification Search ......... 118/694–698, 118/688, 708, 712, 713; 222/58, 65; 427/8; 700/121–123
See application file for complete search history.

(56) References Cited

U.S. PATENT DOCUMENTS 5,433,344 A * 7/1995 Fulton et al. .................. 222/65

6,071,346 A * 6/2000 Yamauchi et al. ........... 118/668
2005/0052850 A1* 3/2005 Dickey et al. ................ 361/724

FOREIGN PATENT DOCUMENTS

JP 11-319686 11/1999

OTHER PUBLICATIONS

Descriptive list of art submission prepared by applicant.
Full English translation of Japanese Patent Application Laid-Open No. 11-319686 prepared by Patent Abstracts of Japan on Mar. 24, 2006.

* cited by examiner

*Primary Examiner*—Yewebdar T Tadesse
(74) *Attorney, Agent, or Firm*—Ostrolenk Faber LLP (57) ABSTRACT

LEDs in an LED display part are arranged so as to have approximately the same placing form as containers. When a chemical solution in a container is exhausted, a corresponding LED of the LED display part lights up. Prior to an operation of replacing the container, an operator allows a bar code reader to read a bar code of an unused container. A bar code reader collator collates the bar code data of the unused container with the bar code data of a container corresponding to the lighting LED, which is already registered in a data base. When the bar code reader collator judges that the chemical solutions in the both containers are identical, the display of the LED is changed from a lighting-up display to a flashing display. This makes it easy to recognize the disposing position of the empty container to be replaced, thereby effectively preventing incorrect replacement of the container.

9 Claims, 8 Drawing Sheets

SUBSTRATE PROCESSING APPARATUS

BACKGROUND OF THE INVENTION

1. Field of the Invention

The present invention relates to a substrate processing apparatus that performs a predetermined processing of a semiconductor substrate, a glass substrate for a liquid crystal display apparatus, a glass substrate for a photomask, a substrate for an optical disk, and the like (which are hereinafter simply referred to as a "substrate"). In particular, the invention relates to an improvement in a technique of notifying the condition of a chemical solution in a chemical solution container.

2. Description of the Background Art

Conventionally, there has been known a method of replacing a chemical solution container based on data read from a data display part of the chemical solution container.

However, in the conventional method of replacing a chemical solution container, a display part of a chemical solution container to be replaced does not light up until a read part reads a data display part (a bar code) of the chemical solution container. Therefore, when an operator of a substrate processing apparatus (hereinafter referred to simply as an "operator") performs a replacing operation at an arrangement part of chemical solution containers, the operator cannot recognize which chemical solution container should be replaced, until the read part reads the data display part.

Moreover, a plurality of chemical solution containers are arranged in the arrangement part, and the respective display parts to display the condition of a chemical solution are disposed for each of the chemical solution containers. In other words, these display parts are disposed separately in the arrangement part. At the time of replacement, the operator is therefore required to find which of the plurality of display parts so disposed is lighting up, and hence it is not easy to recognize a location of a chemical solution container to be replaced.

SUMMARY OF THE INVENTION

The present invention is directed to a substrate processing apparatus that performs a predetermined processing of a substrate by supplying a chemical solution stored in a plurality of chemical solution containers to a corresponding substrate processing part.

According to the present invention, the substrate processing apparatus includes a read part, a register part, a display part, and a controller. The read part reads data of the chemical solution containers. The register part registers a type of a chemical solution and a placing position in association with each other for each of the chemical solution containers. The display part notifies a condition of a chemical solution in a chemical solution container arranged at the placing position. The controller controls a display operation of the display part thereby to enable a first display to notify that a chemical solution container at the placing position is empty, and enable a second display to notify, after the first display is executed, that a type of a chemical solution in a chemical solution container read by the read part is identical with a type of a chemical solution in an empty chemical solution container.

This achieves effective prevention of the occurrence of incorrect replacement of a chemical solution container.

Preferably, there is further provided with a specify part that specifies a data portion about a type of a chemical solution in data read by the read part, and judgment of the type of the chemical solution is executed based on the data portion.

In judging the type of a chemical solution, it is possible to prevent effectively an erroneous judgment that different chemical solutions are stored, although the same chemical solutions are stored in a plurality of chemical solution containers to be compared.

Preferably, the respective display elements of the display part are arranged so as to have approximately the same placing form as the chemical solution containers.

It is easy for an operator to find a location where an empty chemical solution container or a chemical solution container to be replaced is disposed.

Preferably, the controller enables, upon activation of a confirmation mode to confirm the correspondence between a placing position and a type of the chemical solution registered by the register part, a third display to notify a placing position of a chemical solution container storing the same chemical solution as a chemical solution container read by the read part.

Confirming the third display enables an operator to confirm easily the correspondence between each placing position and a chemical solution.

Accordingly, an object of the present invention is to provide a substrate processing apparatus that facilitates replacement of a chemical solution container.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the present invention will be described below in detail with reference to the accompanying drawings.

<1. Construction of Substrate Processing Apparatus>

Figure 1:
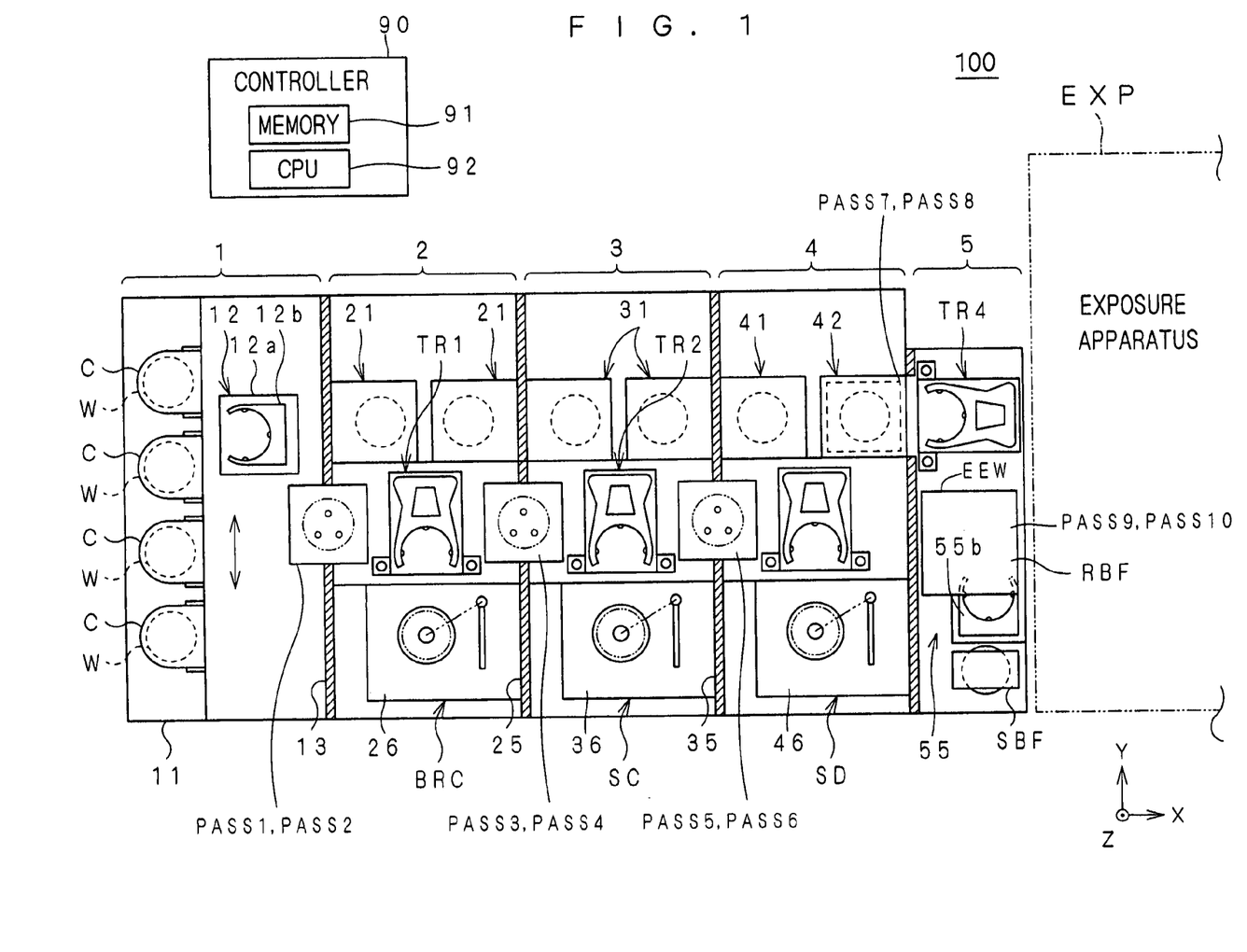
FIG. 1 is a plan view of a substrate processing apparatus according to one preferred embodiment of the present invention.
Figure 2:
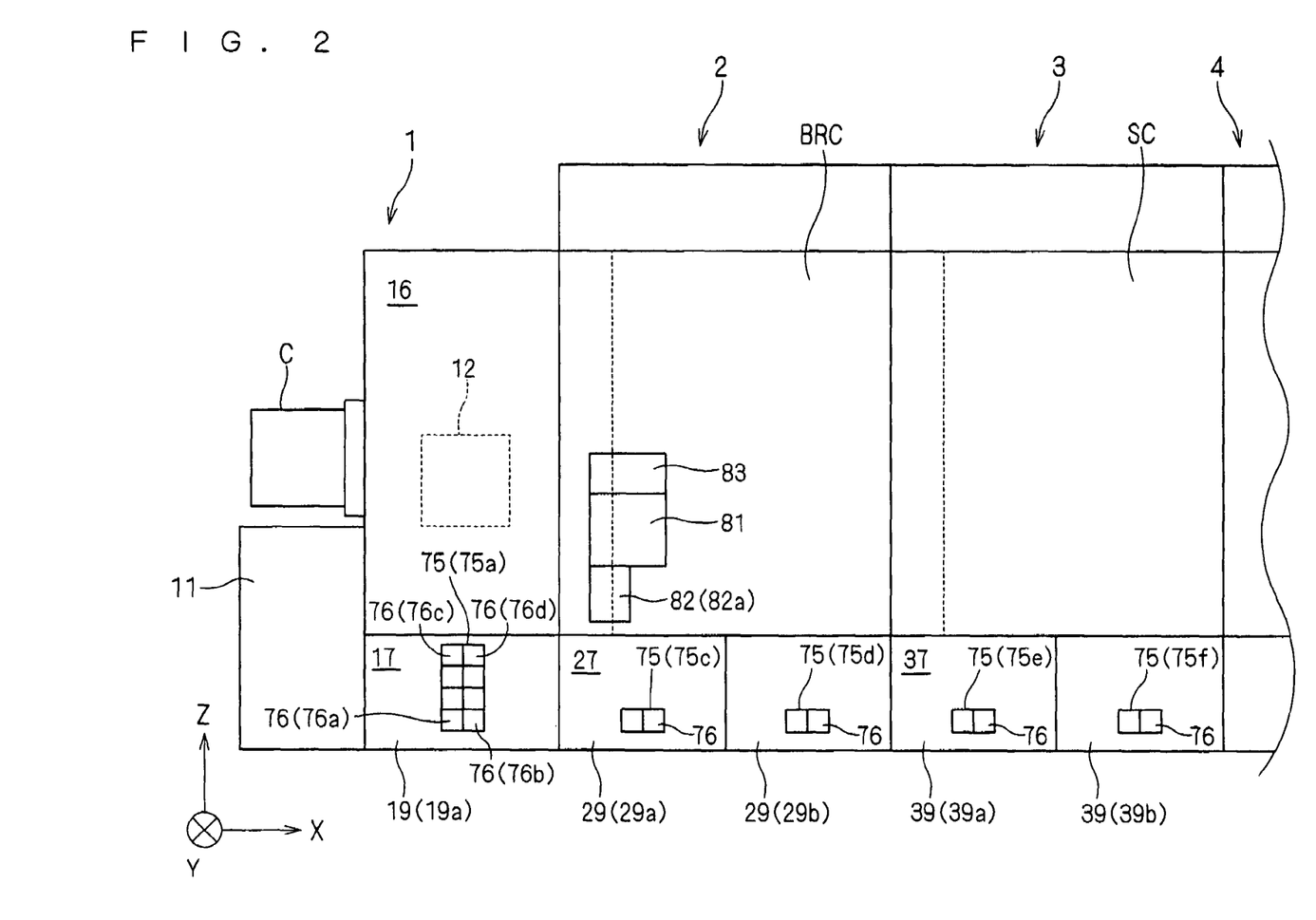
FIGS. 2 and 3 are front views of the substrate processing apparatus in the preferred embodiment.
Figure 3:
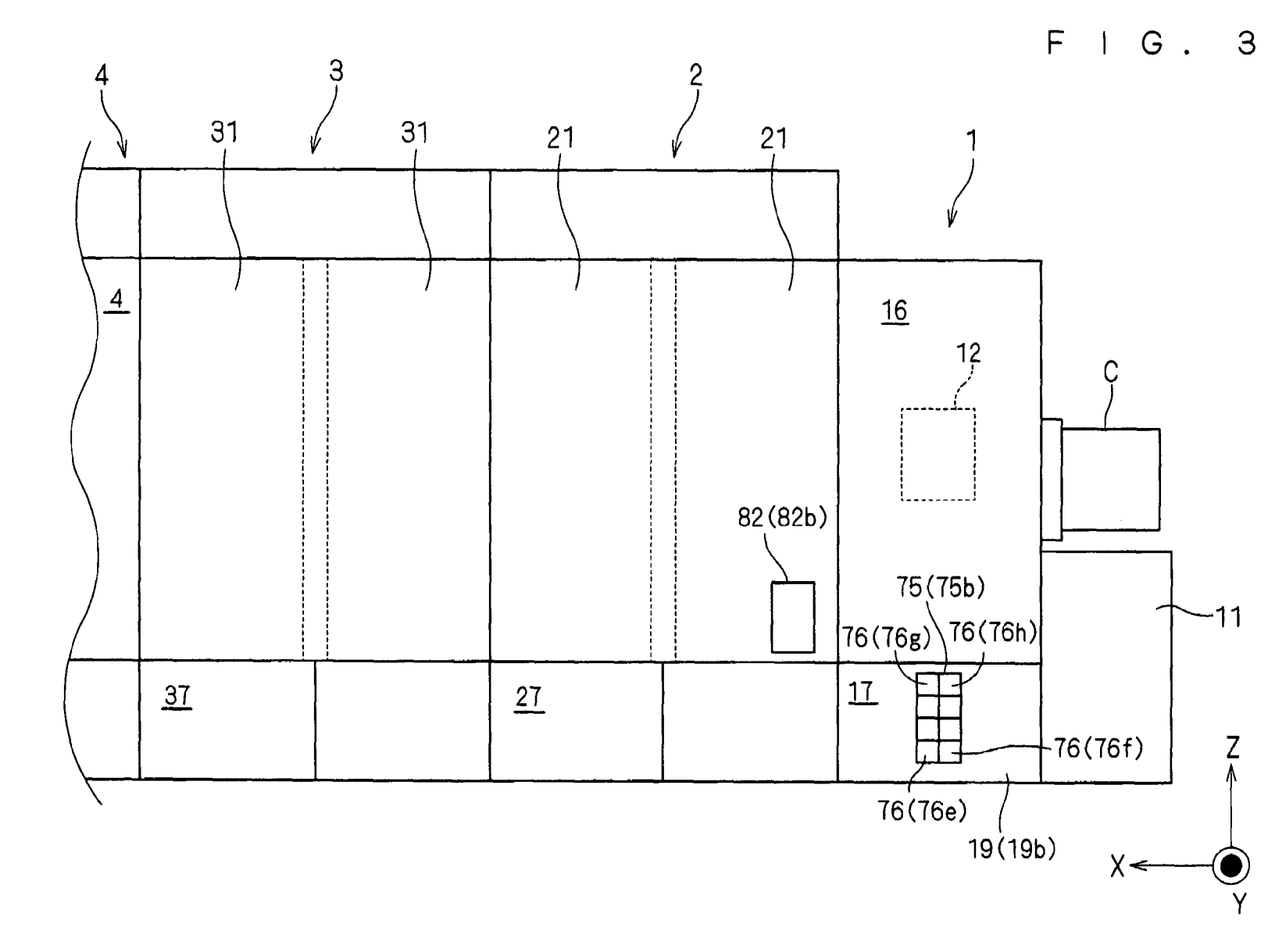

FIG. 1 is a plan view of a substrate processing apparatus 100 according to one preferred embodiment of the invention. FIGS. 2 and 3 are front views of the substrate processing apparatus 100. Here, the substrate processing apparatus 100 is an apparatus that forms an antireflection film, a photo resist film, and a cover film in the order named, and performs development processing of a substrate after completion of exposure processing. FIG. 1 and the succeeding respective figures are accompanied by an XYZ rectangular coordinate system, where the Z-axis direction is the vertical direction, and an XY plane is a horizontal plane, depending on the necessity to suitably clarify their respective directional relationships.

As shown in FIG. 1, the substrate processing apparatus 100 consists mainly of an indexer block 1, three processing blocks to perform a predetermined chemical solution processing of a substrate (specifically, a bark block 2, a resist coating block 3, and a development processing block 4), and an interface block 5. These blocks 1 to 5 are disposed side by side. Further, an exposure apparatus (a stepper), which is an external apparatus separately from the substrate processing apparatus 100, is disposed side by side with respect to the interface block 5. In the following description, the term "processing liquid" is used as a concept that contains de-ionized water or a chemical solution.

The indexer block 1 is a processing block that receives an untreated substrate supplied from the outside of the substrate processing apparatus 100, and discharges to the outside a substrate after completion of a predetermined processing in the substrate processing apparatus 100. As shown in FIG. 1, the indexer block 1 has a mounting table 11 that mounts a plurality of carriers C (four carriers in accordance with this preferred embodiment) side by side, and a substrate transfer mechanism 12 that takes out an untreated substrate W from each carrier C, and stores a treated substrate W at each carrier C.

The substrate transfer mechanism 12 has a movable table 12a that can shift horizontally along the mounting table 11 (along the Y-axis direction), and a holding arm 12b that holds a substrate W in its horizontal position is mounted on the movable table 12a. The holding arm 12b is constructed such that it can move such as up and down (the Z-axis direction) movement, turning movement within a horizontal plane, and advance and withdrawal movement in the turning radius direction.

With this construction, the substrate transfer mechanism 12 can cause the holding arm 12b to access to each carrier C so as to take out an untreated substrate W and transport it to a substrate mounting part PASS1, and so as to store at a corresponding carrier C a treated substrate W received from a substrate mounting part PASS2 of the bark block 2 to be described later.

A cabinet part 17 is disposed under a transporting space 16 of the substrate transfer mechanism 12, as shown in FIGS. 2 and 3. Inside the cabinet part 17 are a power source that supplies power to the substrate processing apparatus 100, and supply piping and chemical solution containers that are used to supply a chemical solution to the blocks 1 to 5, respectively. The cabinet part 17 will be described later in detail.

Performed in the bark block 2 is the processing for forming an antireflection film to reduce standing wave and halation that are generated at the time of exposure. As shown in FIG. 1, the bark block 2 consists mainly of: (i) a base coat processing part BRC formed by stacking arrangement of a plurality of coat processing units 26; (ii) two heat treatment towers 21 formed by stacking arrangement of a plurality of heat treatment units (such as a hot plate and a cooling plate); and (iii) a transport robot TR1 to perform substrate transfer between individual units included in the base coat processing part BRC and the heat treatment towers 21, and substrate mounting parts PASS1 to PASS4.

The respective coat processing units 26 of the base coat processing part BRC can form an antireflection film on the surface of a substrate by supplying a chemical solution to the substrate while keeping the substrate rotating. This can reduce standing wave and halation generated at the time of exposure, permitting excellent exposure processing.

Referring to FIGS. 2 and 3, the cabinet part 27 is disposed under the base coat processing part BRC and the heat treatment tower 21. Inside the cabinet part 27 are supply piping and chemical solution containers that are used to supply a chemical solution to the respective blocks 1 to 5, respectively. The cabinet part 27 will be described later in detail.

Performed in the resist coating block 3 is the processing for forming a resist thin film on a substrate with the antireflection film formed thereon. As shown in FIG. 1, the resist coating block 3 consists mainly of: (i) a resist coat processing part SC formed by stacking arrangement of a plurality of coat processing units 36; (ii) two heat treatment towers 31 formed by stacking arrangement of a plurality of heat treatment units (such as a hot plate and a cooling plate); and (iii) a transport robot TR2 to perform substrate transfer between individual units included in the resist coat processing part SC and the heat treatment towers 31, and substrate mounting parts PASS3 to PASS6.

The resist coat processing units 36 of the resist coat processing part SC can form a resist film on an antireflection film by supplying a chemical solution (resist) to a substrate while keeping the substrate rotating. Besides the formation of a resist film, the coat processing units 36 also perform edge rinse and back rise processing to remove the resist attached to the edge and the back of the substrate.

The cabinet part 37 is disposed under the resist coat processing part SC and the heat treatment towers 31, as shown in FIGS. 2 and 3. Inside the cabinet part 37 are supply piping and chemical solution containers that are used to supply a chemical solution to the respective blocks 1 to 5, respectively. The cabinet part 37 will be described later in detail.

Performed in the development processing block 4 are after-exposure bake processing to perform, at a predetermined timing, heat treatment of a substrate after completion of exposure processing, and development processing that is performed by supplying developer onto a substrate after completion of exposure processing. As shown in FIG. 1, the development processing block 4 consists mainly of: (i) a development processing part SD formed by stacking arrangement of a plurality of development processing units 46; (ii) heat treatment towers 41 and 42 formed by stacking arrangement of a plurality of heat treatment units (such as a hot plate and a cooling plate); and (iii) a transport robot TR3 to perform substrate transfer between individual units, which are included in the development processing part SD and the heat treatment towers 41 and 42, and substrate mounting parts PASS5 to PASS8. Performed in the development processing units 46 are development processing with developer, rinse processing with de-ionized water, and dry processing for shaking the de-ionized water attached to a substrate by rotating the substrate while holing it.

The substrate mounting parts PASS7 and PASS8 are arranged by stacking together with the hot plate and the cooling plate in the heat treatment tower 42. The after-exposure bake processing is performed in a heat treatment unit of the heat treatment tower 42 disposed on the interface block 5 side.

The interface block 5 performs substrate transfer with an exposure apparatus EXP that is used as an exterior unit of the substrate processing apparatus 100. The interface block 5 consists mainly of: (i) a transporting mechanism 55 to perform substrate transfer with the exposure apparatus EXP; (ii) a send buffer SBF to temporarily store a substrate that is not subjected to exposure processing by the exposure apparatus EXP; (iii) a return buffer RBF to temporarily store a substrate after completion of exposure processing; and (iv) a transport robot TR4 to perform substrate transfer between the heat treatment units arranged in the heat treatment tower 42 of the development processing unit 4, and substrate mounting parts PASS7 to PASS 10, respectively.

The transporting mechanism 55 transports into the exposure apparatus EXP a substrate that is already subjected to the formation of an antireflection film and a resist film, and then mounted on the substrate mounting part PASS9. The transporting mechanism 55 also mounts a substrate after completion of exposure processing on the substrate mounting part PASS10. If the exposure apparatus EXP cannot receive a substrate, an interface IFB transports a substrate not subjected to exposure, to the send buffer SBF.

In terms of hardware configuration, the transport robot TR4 transports a substrate, which is already subjected to heat treatment at the heat treatment unit stacked in the heat treatment tower 42, to the return buffer RBF.

Figure 4:
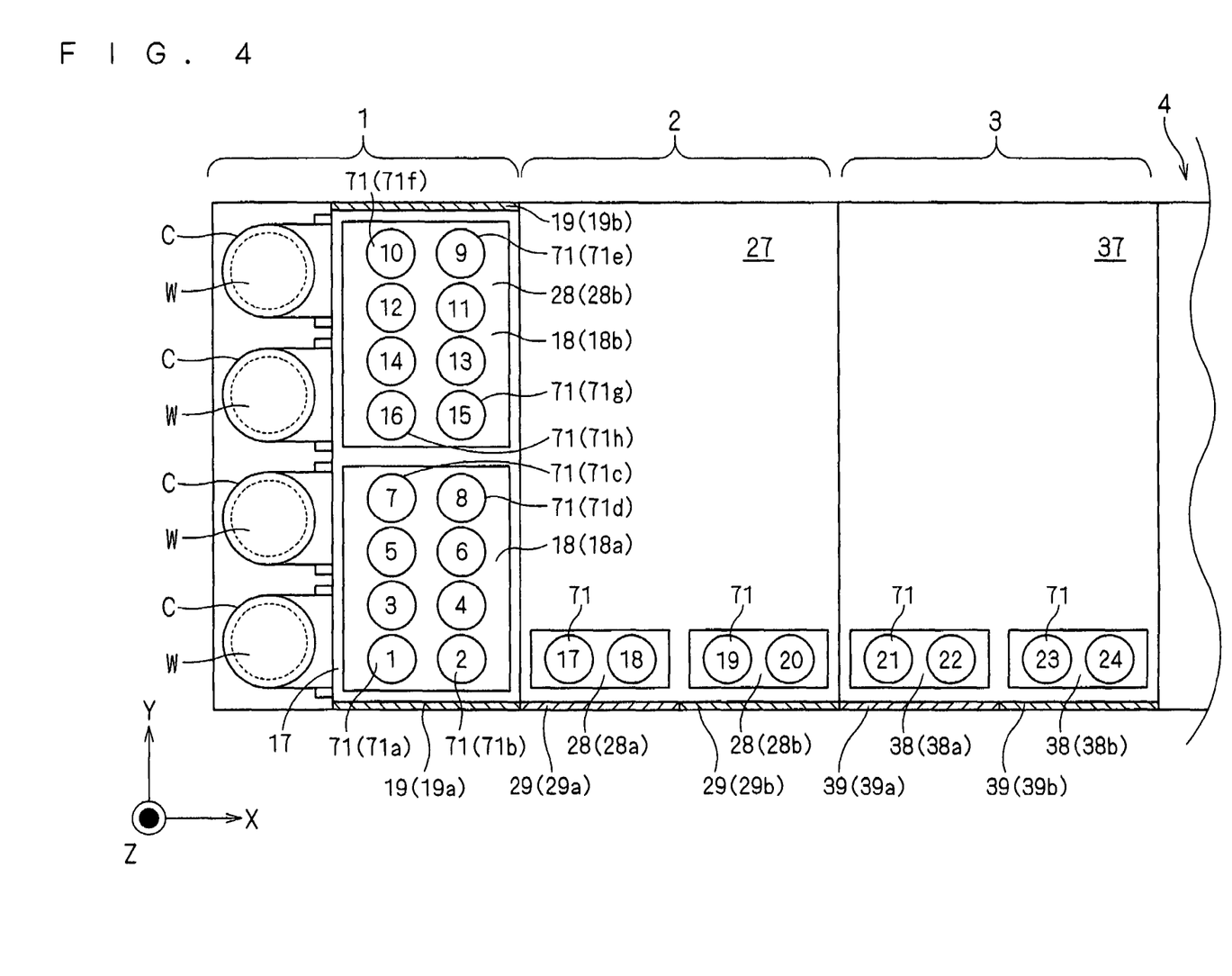
FIG. 4 is a plan view of a cabinet part.
Figure 5:
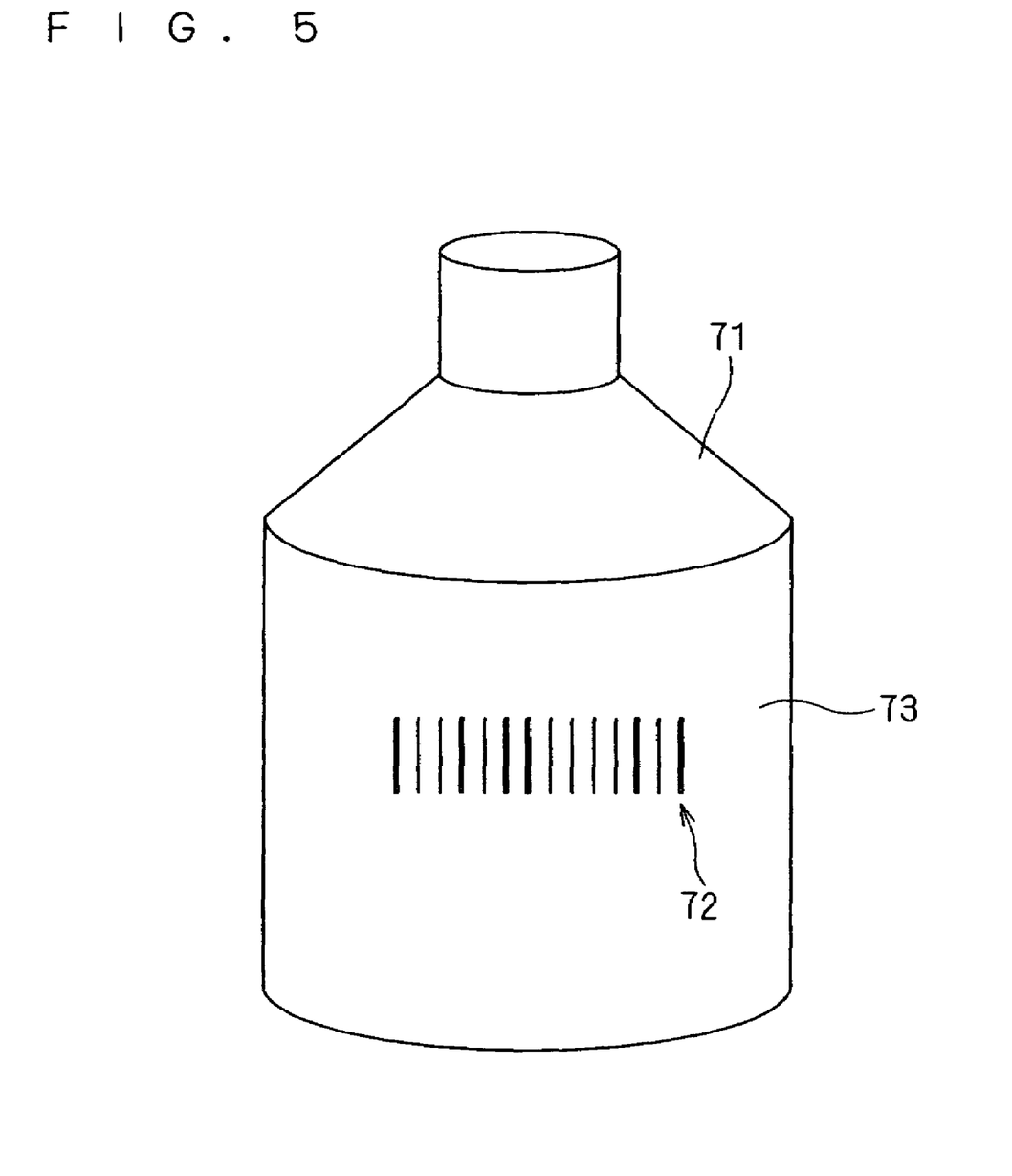
FIG. 5 is a diagram showing an example of a chemical solution container.

FIG. 4 is a plan view of the cabinet parts 17, 27, and 37. FIG. 5 is a diagram showing an example of a chemical solution container 71. Each chemical solution container 71 stores a chemical solution such as one used for a resist, an antireflection film, or developer. A body part 73 of the chemical solution container (hereinafter referred to simply as a "container") 71 has a bar code 72 storing data of the container. As used here, the data of the container contains not only the data about the type of a chemical solution stored in the container, but also other data such as the production number of the chemical solution.

The cabinet part 17 is disposed under a transporting space 16 of the substrate transfer mechanism 12, which is the underside of the indexer block 1, as shown in FIGS. 2 and 3. As shown in FIG. 4, inside the cabinet section 17 are storage parts 18a and 18b for storing a plurality of containers 71, which are disposed on doors 19a and 19b sides, respectively.

Therefore, an operator can perform replacing operation or the like of the containers 71 stored in the storage parts 18a and 18b by opening the doors 19a and 19b, respectively. In this preferred embodiment, each of the storage parts 18a and 18b stores eight containers 71.

Assigned to a location where each container 71 is arranged in the storage part 18a is a "placing number" that can uniquely determine its placing position. For example, with respect to the containers 71 stored in the storage part 18a, the placing numbers of "1", "2", "7" and "8" are assigned to the left and foremost row one when viewed from the door 19a side (the container 71a), the right and foremost row one (the container 71b), the left and rearmost row one (the container 71c), and the right and rearmost row one (the container 71d), respectively.

Similarly, with respect to the containers 71 stored in the storage part 18b, the placing numbers of "9", "10", "15" and "16" are assigned to the left and foremost row one when viewed from the door 19b side (the container 71e), the right and foremost row one (the container 71f), the left and rearmost row one (the container 71g), and the right and rearmost row one (the container 71h), respectively.

The cabinet part 27 is disposed under the base coat processing part BRC and the heat treatment tower 21, which is the underside of the bark block 2, as shown in FIGS. 2 and 3. As shown in FIG. 4, inside the cabinet part 27 are storage parts 28a and 28b for storing a plurality of containers 71 (two containers in this preferred embodiment), which are disposed on doors 29a and 29b sides, respectively. Therefore, an operator can perform replacing operation or the like of the containers 71 stored in the storage parts 28a and 28b by opening the doors 29a and 29b, respectively.

Assigned to a location where each container 71 is arranged in the storage part 28a is a "placing number" that can uniquely determine its placing position. That is, with respect to the containers 71 stored in the storage part 28a, the placing numbers of "17" and "18" are assigned to the left one when viewed from the door 29a side, and the right one, respectively.

Similarly, assigned to a location where each container 71 is arranged in the storage part 28b is a "placing number" that can uniquely determine its placing position. The placing numbers of "19" and "20" are assigned to the left one when viewed from the door 29b side, and the right one, respectively.

The cabinet part 37 is disposed under the resist coat processing part SC and the heat treatment tower 31, which is the underside of the resist coating block 3, as shown in FIGS. 2 and 3. As shown in FIG. 4, inside the cabinet part 37 are storage parts 38a and 38b for storing a plurality of containers 71 (two containers in this preferred embodiment), which are disposed on doors 39a and 39b sides, respectively. Therefore, an operator can perform replacing operation or the like of the containers 71 stored in the storage parts 38a and 38b by opening the doors 39a and 39b, respectively.

Assigned to a location where each container 71 is arranged in the storage part 38a is a "placing number" that can uniquely determine its placing position. The placing numbers of "21" and "22" are assigned to the left one when viewed from the door 39a side, and the right one, respectively.

Similarly, assigned to a location where each container 71 is arranged in the storage part 38b is a "placing number" that can uniquely determine its placing position. The placing numbers of "23" and "24" are assigned to the left one when viewed from the door 39b side, and the right one, respectively.

Thus, in this preferred embodiment, the "placing number" can identify uniquely the containers 71 arranged in the corresponding storage parts 18a, 18b, 28a, 28b, 38a, and 38b. Also, the "placing number" can specify the placing position of each container 71.

<2. Construction of Neighborhood of Cabinet Parts>

Figure 6:
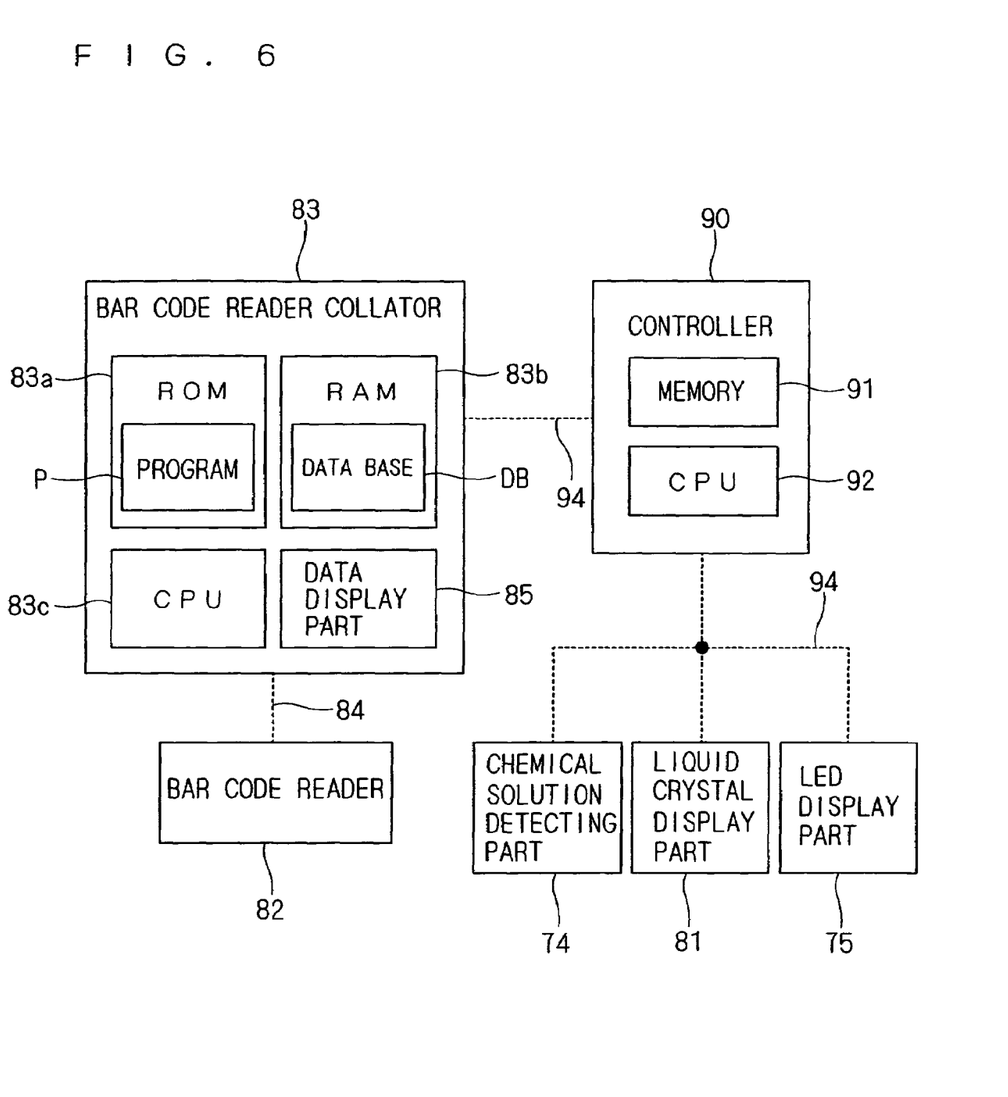
FIG. 6 is a block diagram for the purpose of explaining a main electrical configuration of the substrate processing apparatus.
Figure 7:
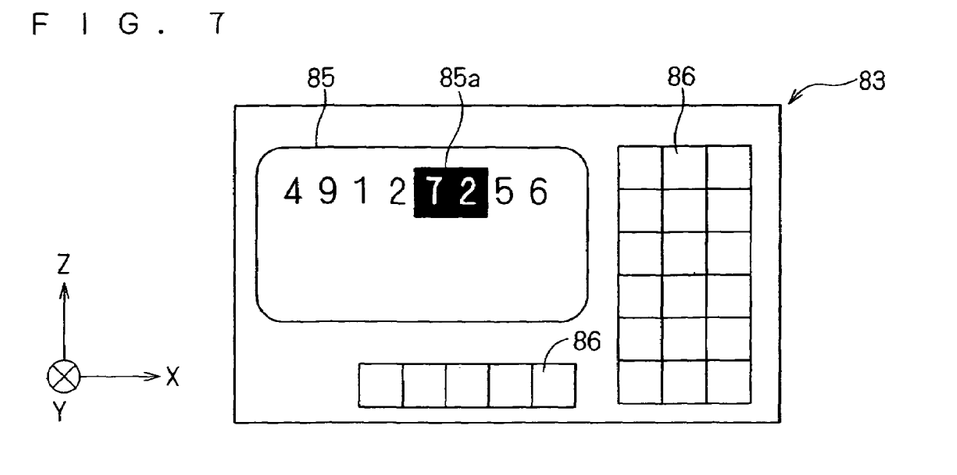
FIG. 7 is a front view of a bar code reader collator.
Figure 8:
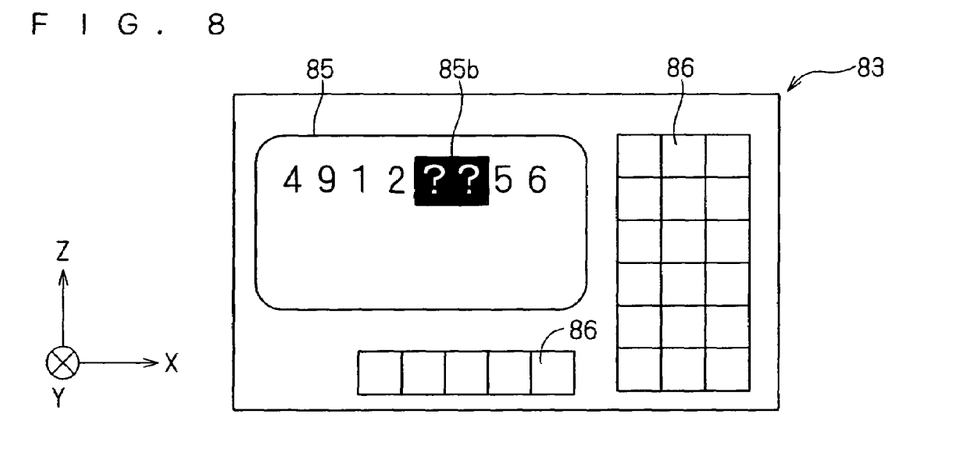
FIGS. 8 and 9 are diagrams for the purpose of explaining a method of specifying data about the type of a chemical solution by the bar code reader collator.
Figure 9:
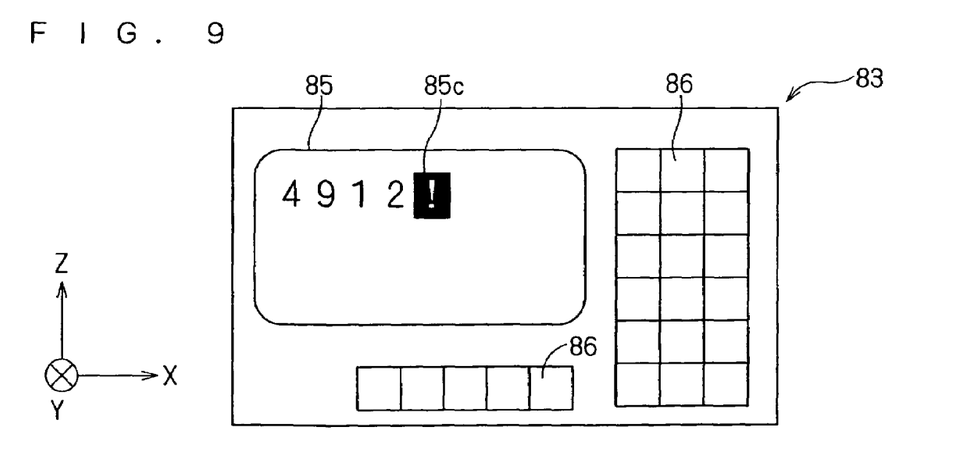

FIG. 6 is a block diagram for the purpose of explaining the main electrical configuration of the substrate processing apparatus 100. FIG. 7 is a front view of a bar code reader collator 83. FIGS. 8 and 9 are diagram for the purpose of explaining a method of specifying data about the type of a chemical solution by the bar code reader collator 83. The hardware configurations of the neighborhood of the cabinet parts 17, 27, and 37 will be described here with reference to FIGS. 2, 3, and 6 to 9.

As shown in FIG. 2, the side surface of the base coat processing part BRC among the side surfaces of the bark block 2 is provided with a liquid crystal display part 81, a bar code reader 82a, and the bar code reader collator 83. As shown in FIG. 3, the side surface of the heat treatment tower 21 among the side surfaces of the bark block 2 is provided with a bar code reader 82b.

The liquid crystal display part 81 is a display part having the function as a "touch panel," on which a position on a screen can be specified by touching the screen with a finger or a dedicated pen. Therefore, an operator can specify the operating condition of the substrate processing apparatus 100 by carrying out an instruction through the use of a "touch panel" function of the liquid crystal display part 81 based on the content displayed on the liquid crystal display part 81. If a problem such as a substrate processing failure or the like occurs in the substrate processing apparatus 100, caution and its detail can be displayed on the liquid crystal display part 81.

As shown in FIGS. 2 and 3, attached to the outer side surfaces of the doors 19a and 19b are LED display parts 75

(75a, 75b) that notify the condition of a chemical solution in a container 71 stored in the storage parts 18a and 18b, respectively. In other words, the LED display parts 75a and 75b are disposed on the doors 19a and 19b of the cabinet part 17, respectively.

Each of the LED display parts 75a and 75b has a plurality of (eight in number in this preferred embodiment, which are equal in number to that of the containers 71 stored in each of the storage parts 18a and 18b) LEDs 76. These LEDs 76 are display elements to notify an operator of the condition of a chemical solution in a corresponding container 71 (e.g., the fact that the residual quantity of the chemical solution in the container is zero, or it is the container to be replaced, or the like). As shown in FIGS. 2 and 3, the display elements 76 of the LED display parts 75 (75a, 75b) are arranged so as to have approximately the same placing form as the containers 71 stored in the storage parts 18 (18a, 18b).

Specifically, the LEDs 76a, 76b, 76c, and 76d of the LED display part 75a notify the conditions of chemical solutions in the containers 71a, 71b, 71c, and 71d in the storage part 18a, respectively. The LEDs 76e, 76f, 76g, and 76h of the LED display part 75b notify the conditions of chemical solutions in the containers 71e, 71f, 71g, and 71h in the storage part 18b, respectively.

Attached to the outer side surfaces of the doors 29a, 29b, 39a, and 39b are LED display parts 75 (75c to 75f) that notify the conditions of chemical solutions in the containers 71 stored in the storage parts 28a, 28b, 38a, and 38b, respectively. That is, the LED display parts 75c and 75d are disposed on the doors 29a and 29b of the cabinet part 27, respectively. The LED display parts 75e and 75f are disposed on the doors 39a and 39b of the cabinet part 37, respectively.

Each of the LED display parts 75c to 75f has a plurality of (two in number in this preferred embodiment, which are equal in number to that of the containers 71 stored in each of the storage parts 28a, 28b, 38a, and 38b) LEDs 76. The respective display elements 76 of the LED display part 75 (75c to 75f) are arranged so as to have approximately the same placing form as the containers 71 stored in the storage parts 28a, 28b, 38a, and 38b.

Therefore, by confirming the display of the LED display part 75 (e.g., a lighting-up display or a flashing display of each LED 76, which will be described later), an operator can recognize easily a location where an empty container 71 or a container 71 to be replaced is disposed. Thus, the LED display part 75 is used as a display part to notify the condition of a chemical solution in each container 71.

Since the respective LED display parts 75 (75a to 75f) are disposed in the vicinity of the corresponding storage parts 18a, 18b, 28a, 28b, 38a, and 38b, an operator can perform a replacing operation of a container 71 while confirming a display of the LED display part 75.

Moreover, since the respective LED display parts 75 are set outside the substrate processing apparatus 100, an operator can recognize the placing position of an empty container 71 and a container 71 to be replaced, from the outside of the substrate processing apparatus 100 without opening the door 19a, 19b, 29a, 29b, 39a, or 39b.

The bar code reader 82 is a read part to read the bar code 72 provided on the body part 73 of a container 71. As shown in FIG. 6, the bar code reader 82 is electrically connected via a signal line 84 to the bar code reader collator 83, and inputs data (information) about the container 71 recorded in the bar code 72, into the bar code reader collator 83.

The bar code reader collator 83 is a unit to (i) register data that the bar code reader 82 reads from the bar code 72 of each container 71 (hereinafter referred to as "bar code data"), by associating it with a "placing number" corresponding to a location at which the container 71 is placed; and (ii) collate the registered data in reply to a request from the controller 90, or based on data inputted from the bar code reader 82.

As shown in FIGS. 6 and 7, the bar code reader collator 83 consists mainly of: a ROM 83a, a RAM 83b, and a CPU 83c that are control elements to execute processing about bar code data; a data display part 85; and a key 86.

The ROM 83a is a read only memory, and stores a program P needed in register and collation processing of bar code data. The RAM 83b is a memory free to read and write, and stores a data base DB in which "placing numbers" assigned to the storage parts 18a, 18b, 28a, 28b, 38a, and 38b, and the bar code data are registered in association with each other. In the following description, the data base DB has a plurality of records composed of the "placing numbers" and "bar code data."

The CPU 83c is an arithmetic processing unit to execute control under the program P stored in the ROM 83a. This enables the bar code reader collator 83 to execute processing, such as register and collation of bar code data, at a predetermined timing. That is, the CPU 83c is used as a register part and a collation part of bar code data.

The data display part 85 displays bar code data inputted from the bar code reader 82, or data inputted through an operator's operation of the key 86. Operating a predetermined key 86 enables an operator to register the data displayed on the data display part 85 in the data base DB stored in the RAM 83b, or correct the register content of the data base DB.

In this preferred embodiment, data about a chemical solution type in the data stored in the bar code 72 of each container 71 is registered in association with the placing position of the container 71 in the data base DB. However, as above described, the bar code data may contain not only data about a chemical solution type stored therein, but also data other than the chemical solution type in some cases. If bar code data contains data other than a chemical solution type, it is necessary to extract only the data about the chemical solution type and register it in the data base DB. The followings are a technique of specifying data about a chemical solution type in bar code data and register it in the data base DB, and a technique of collating it with data registered in the data base DB.

First, a technique of specifying data about a chemical solution type in bar code data and register it in the data base DB will be described by considering the case where bar code data inputted into the bar code reader collator 83 by the bar code reader 82 is "49127256," and the high order four digits in the inputted bar code data (i.e., "4912") and the low order two digits (i.e., "56") are data about the chemical solution type.

An operator specifies a location of data about a chemical solution type by operating the key 86 of the bar code reader collator 83 such that characters other than those of the data about the chemical solution type, that is, the low order third and fourth digits of the bar code data are replaced by the symbol "?" (see FIG. 8).

Subsequently, the operator operates a predetermined key 86 to associate the corrected bar code data "4912??56" with a "placing number" and register it in the data base DB. Thus, the bar code reader collator 83 is also used as a specifying part that specifies a data portion about a chemical solution type.

As used herein, the symbol "?" is a special character that is a substitute for an arbitrary character. In other words, a location specified by "?" indicates that no character type is specified. Therefore, when data inputted from the bar code reader 82 is collated with data registered in the data base DB, for example, when data "4912??56" registered in the data base DB is collated with data "49128356" inputted from the bar code reader 82, the bar code reader collator 83 judges that both data are identical.

Next, other technique of specifying data about a chemical solution type in bar code data will be described by considering the case where bar code data inputted into the bar code reader collator 83 by the bar code reader 82 is "49127256," and the high order four digits in the inputted bar code data (i.e., "4912") are data about the chemical solution type.

To specify the location of data about a chemical solution type, an operator replaces with the symbol "!" a data portion other than data about the chemical solution type, that is, the high order fifth and the following character string in bar code data (see FIG. 9). Subsequently, the operator operates the key 86 to allow "4912?" to be associated with a "placing number" and registered in the data base DB.

As used herein, the symbol "!" is a special character that is a substitute for an arbitrary character string ("0" or more in the length of a character string). In other words, a location specified by the symbol "!" indicates a character string to which no character type is specified, or indicates that no character exists. Therefore, when the data inputted from the bar code reader 82 is collated with the data registered in the data base DB, for example, when the data "4912!" registered in the data base DB is collated with the data "49128356" inputted from the bar code reader 82, the bar code reader collator 83 judges that both data are identical.

Thus, in this preferred embodiment the same type of chemical solution types can be judged by registering data, which can be obtained by replacing part of bar code data inputted from the bar code reader 82 with the special character of "?" or "!", as bar code data in the data base DB, and then by collating it with the bar code data containing the special character. That is, in judging the same type of chemical solution types between the containers 71 in this preferred embodiment, even if the bar code 72 contains data other than data about a chemical solution type, only the specified data about the chemical solution type can be used by using the special character.

Hence, in judging the chemical solution type between the containers 71, it is possible to prevent effectively an erroneous judgment that different chemical solutions are stored, although the same chemical solutions are stored. For example, data "49127256" and data "49128356" are different from each other in terms of bar code data. However, data "4912??56", which is obtained by replacing the low order third and fourth digits of "49127256" with the symbol "?", and data "49128356" can be judged as identical because only the data about the chemical solution type is collated.

It is therefore easy to judge the same type of chemical solution types between bar codes containing data other than data about a chemical solution type.

As shown in FIGS. 1 and 6, the controller 90 has a memory 91 to store a program and a variable etc., and a CPU 92 to execute control under a program stored in the memory 91. The controller 90 is also electrically connected via a signal line 94 to a chemical solution detecting part 74 to detect the residual quantity of a chemical solution in each container 71, a liquid crystal display part 81, an LED display part 75, and a bar code reader collator 83.

Accordingly, the CPU 92 can execute an operation of display or the like of the liquid crystal display part 81 and the LED display part 75, at a predetermined timing under a program stored in the memory 91. The CPU 92 can also cause the bar code reader collator 83 to execute collation processing or the like at a predetermined timing.

<3. Notification of Condition of Chemical Solution by LED Display Part>

Figure 10:
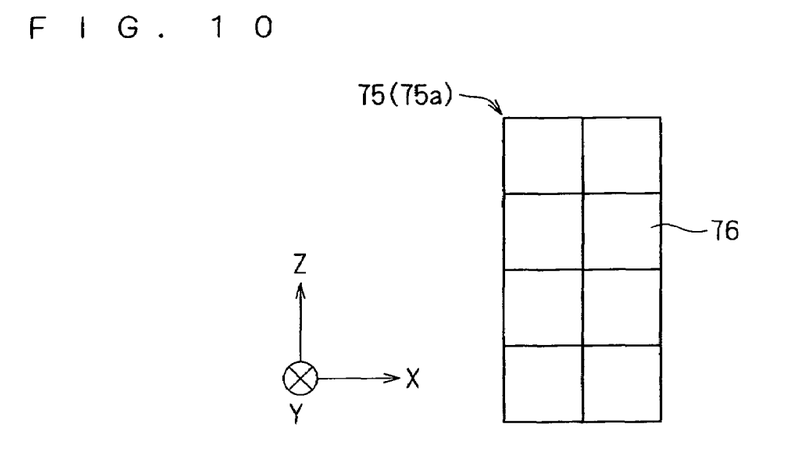
FIGS. 10 to 12 are diagrams for the purpose of explaining a method of notifying condition of a chemical solution by an LED display part.
Figure 11:
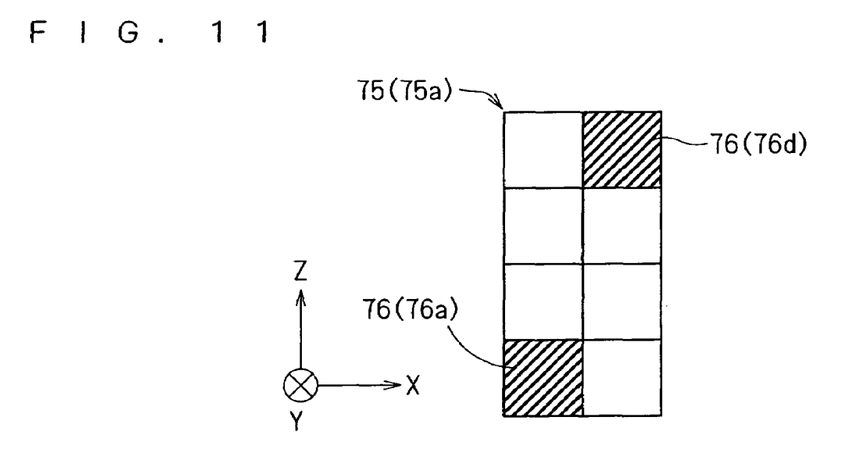
Figure 12:
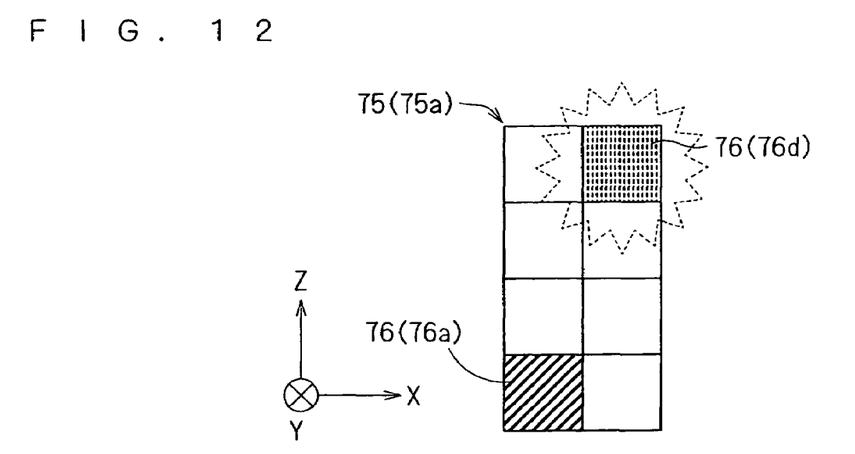

FIGS. 10 to 12 are diagrams for the purpose of explaining a method of notifying condition of a chemical solution by the LED display part 75. The following is a method of notifying an operator of the condition of a chemical solution in each container 71 by the LED display parts 75 (75a to 75f). In FIGS. 10 to 12, the not-hatched LED 76 indicates the unlit one.

In the case where the condition of operation of the substrate processing apparatus 100 in this preferred embodiment is a normal mode, when a chemical solution detecting part 74 (see FIG. 6) detects exhaustion of a chemical solution in a container 71, a corresponding LED 76 lights up, signaling the exhaustion. For example, when the chemical solutions in the containers 71a and 71d of the storage part 18a are exhausted, corresponding LEDs 76a and 76d of the LED display part 75a light up, respectively. That is, the LED display part 75a can notify an operator, through the lighting-up display of the LEDs 76a and 76d, that the corresponding containers 71a and 71d are empty. The operator can therefore recognize easily at which storage part 18 and at which position an empty chemical solution container is located, by confirming the condition of a display of the LED display part 75 disposed outside the substrate processing apparatus 100.

After a predetermined LED 76 of the LED display part 75 lights up, the operator reads, prior to a replacing operation of the container 71, the bar code 72 of an unused container 71 by the bar code reader 82. When the bar code data of the unused container 71 is inputted in the bar code reader collator 83, the bar code reader collator 83 collates the bar code data of the unused container 71 with the bar code data of the container 71 corresponding to the lighting LED 76, which is already registered in the data base DB.

When the bar code reader collator 83 judges that the types of chemical solutions in the two containers 71 are identical, the controller 90 changes the display of the corresponding LED 76 from a lighting display to a flashing display. Confirming the condition of the display of the LED display part 75 enables the operator to recognize easily that the container 71 at a placing position corresponding to the flashing LED 76 should be replaced with an unused container 71. For example, as shown in FIG. 12, when the LED 76d is changed from a lighting-up display to a flashing display, the operator replaces the container 71 at a placing position corresponding to the LED 76d, with an unused container 71. This prevents the occurrence of incorrect replacement of the container 71.

On the other hand, when judged that the types of chemical solutions in the two containers 71 are not identical, the LED 76 remains the lighting-up display. The liquid crystal display part 81 displays a message indicating that an unused container 71, whose bar code 72 has been read, does not store a chemical solution to be replaced.

Thus, confirming the lighting display and the flashing display of the LED display part 75 can ensure that the operator places an unused container 71 at the placing position of a container to be replaced. This achieves effective prevention of the occurrence of incorrect replacement of the container 71.

Additionally, the substrate processing apparatus 100 of this preferred embodiment can notify an operator, through the LED display part 75, at which of the storage parts 18a, 18b, 28a, 28b, 38a, and 38b a container 71 storing the same chemical solution as a container 71 read by the bar code reader 82 (e.g., an unused container) is placed, without limiting the case where a chemical solution is exhausted. In other words, the operator can confirm the association between the type of a chemical solution and the placing position of a container 71.

In the operation of confirmation, the operator operates the key 86 of the bar code reader collator 83 so as to change the condition of operation of the substrate processing apparatus 100 from a normal mode to a confirmation mode. Specifically, the operator can activate the confirmation mode by operating the key 86. Subsequently, the operator causes the code reader 82 to read the bar code 72 of a container 71 that stores a chemical solution to be confirmed.

When the bar code data of the container 71 is inputted into the bar code reader collator 83, the bar code reader collator 83 collates the read bar code data with bar code data registered in the data base DB. Then, the bar code reader collator 83 extracts record that is identical with the bar code data read from the data base DB, and sends a "placing number" of each extracted record to the controller 90. Upon receipt of the "placing number" from the bar code reader collator 83, the controller 90 permits lighting-up of an LED 76 that has the corresponding "placing number" in the LEDs 76 of the LED display parts 75 (75a to 75f).

In the confirmation mode of this preferred embodiment, if, after the LED display parts 75 (75a to 75f) are allowed to display the condition of association between the type of a chemical solution and the placing position of a container 71, the bar code reader 82 further reads a bar code 72 of another container 71, the condition of association about the type of the chemical solution in the another container 71 is displayed on the LED display parts 75 (75a to 75f). The operator then changes the condition of operation of the substrate processing apparatus 100, from the confirmation mode to the normal mode, thereby completing the operation of confirmation of the condition of association.

Thus, the operator can cause the LED 76, which corresponds to the placing position of a container 71 storing a chemical solution to be confirmed, to light up by allowing the bar code reader 82 to read the container 71 storing the chemical solution to be confirmed. In other words, the lighting-up display of the LED 76 of the respective LED display parts 75 (75a to 75f) enables to notify the operator of the placing position of the container 71 storing the same chemical solution. Therefore, looking at the display of the LED display part 75 enables the operator to find easily a location at which a chemical solution to be confirmed is placed.

<4. Advantages of Substrate Processing Apparatus of Preferred Embodiment>

As above described, the substrate processing apparatus 100 of the above preferred embodiment causes a corresponding LED 76 to light up when the chemical solution in a container 71 is exhausted. The substrate processing apparatus 100 also performs, prior to the operation of replacing an empty container 71 with an unused container 71, the processing of reading the bar code 72 of the unused container 71 and judging whether the chemical solutions stored in the both containers 71 are identical or not. When the both are identical, the display of an LED 76 corresponding to the empty container 71 to be replaced is changed from the lighting-up display to the flashing display. This enables the operator to find easily one of empty containers 71 which should be replaced with the unused container 71, thereby achieving effective prevention of the occurrence of incorrect replacement of the container 71.

<5. Modifications>

While the invention has been shown in the foregoing preferred embodiment, it is not so limited but is susceptible of various changes and modification as follows.

Firstly, although the display element 76 is an LED in the foregoing preferred embodiment, it may be a fluorescent lamp, a halogen lamp, an incandescent lamp, for example.

Secondly, although the LED display parts 75 (75a to 75f) are attached to the outside of their respective corresponding doors 19a, 19b, 29a, 29b, 39a, and 39b in the foregoing preferred embodiment, ones similar to the LED display parts 75 (75a to 75f) disposed outside may be disposed on the inside of their respective corresponding doors 19a, 19b, 29a, 29b, 39a, and 39b. With this construction, even if an operator replaces a container 71 by opening a door, the operator can confirm a replacing position by the LED display part 75 that is disposed on the inside of the door.

Thirdly, although each container 71 stores a chemical solution in the foregoing preferred embodiment, it may store de-ionized water.

Fourthly, although each record of the data base DB is composed of two data of a "placing number" and "bar code data," it may be composed of three or more data.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus that performs a predetermined processing of a substrate by supplying chemical solutions stored in a plurality of chemical solution containers to a corresponding substrate processing part, comprising:
  (a) a read part that reads each item of data about the plurality of said chemical solution containers;
  (b) a storing portion configured to store a data base pertaining to the plurality of said chemical solution containers;
  (c) a register part that registers and associates a type of a chemical solution and a placement position thereof, for each of the plurality of said chemical solution containers in said data base;
  (d) a display part that notifies condition of a chemical solution in each of the plurality of said chemical solution containers arranged at the placement position; and
  (e) a controller configured:
    (i) to notify said placement position of an empty chemical solution container with a first display of said display part; and
    (ii) to notify said placement position of said empty chemical solution container with a second display of said display part, which is located outside of said substrate processing apparatus, after said first display is executed, when the type of the chemical solution, read by said read part, is identical with a type of a chemical solution being extracted from said data base in accordance with said placement position of said empty chemical solution container.

2. The substrate processing apparatus according to claim 1, further comprising: a specifying part that specifies a data portion about a type of a chemical solution, in data read by said read part, wherein judgment of said type of said chemical solution is executed based on said data portion.

3. The substrate processing apparatus according to claim 1, wherein said controller is configured to permit lighting-up of a display element corresponding to said placement position in said display part.

4. The substrate processing apparatus according to claim 3, wherein individual display elements of said display part are arranged so as to have approximately the same placing form as said chemical solution containers.

5. The substrate processing apparatus according to claim 1, wherein said controller is configured to permit flashing of a display element corresponding to said placement in said display part, as said second display.

6. The substrate processing apparatus according to claim 5, wherein individual display elements of said display part are arranged so as to have approximately the same placing form as said chemical solution containers.

7. The substrate processing apparatus according to claim 1, wherein said display part is disposed at a cabinet part storing a corresponding chemical solution container.

8. The substrate processing apparatus according to claim 7, wherein said display part is disposed on an outer side surface of a cabinet part storing a corresponding chemical solution container.

9. The substrate processing apparatus according to claim 1, comprising:

said controller further comprising, (iii) a third display which is configured to notify by displaying on said display part, a placement position of a chemical solution container storing the same chemical solution as a chemical solution container, read by said read part, upon activation of a confirmation mode to confirm a correspondence between said placement position and said type of said chemical solution registered by said register part.

* * * * *